(12) United States Patent
Mariner et al.

(10) Patent No.: US 7,364,624 B2
(45) Date of Patent: Apr. 29, 2008

(54) WAFER HANDLING APPARATUS AND METHOD OF MANUFACTURING THEREOF

(75) Inventors: John Thomas Mariner, Avon Lake, OH (US); Timothy J. Hejl, Independence, OH (US); Douglas Alan Longworth, Cleveland Heights, OH (US); Jeffrey Lennartz, Cleveland, OH (US); Ajit Sane, Medina, OH (US); Andrew John Macey, Medina, OH (US); Jon Leist, North Olmsted, OH (US); Thomas E. Devan, Westlake, OH (US)

(73) Assignee: Momentive Performance Materials Inc., Wilton, CT (US)

( * ) Notice: Subject to any disclaimer, the term of this patent is extended or adjusted under 35 U.S.C. 154(b) by 91 days.

(21) Appl. No.: 10/759,582

(22) Filed: Jan. 16, 2004
(Under 37 CFR 1.47)

(65) Prior Publication Data
US 2004/0173161 A1 Sep. 9, 2004

Related U.S. Application Data

(60) Provisional application No. 60/442,409, filed on Jan. 24, 2003, provisional application No. 60/441,165, filed on Jan. 17, 2003.

(51) Int. Cl.
- C23C 16/00 (2006.01)
- C23F 1/00 (2006.01)
- H01L 21/306 (2006.01)

(52) U.S. Cl. .................. 118/725; 156/345.52; 118/728; 361/234

(58) Field of Classification Search ............... 118/728; 156/345.51, 345.52; 427/481
See application file for complete search history.

(56) References Cited

U.S. PATENT DOCUMENTS

| 5,210,452 | A | * | 5/1993 | Pratap et al. | ................. 310/12 |
| 5,231,690 | A | | 7/1993 | Soma et al. | ................ 392/416 |
| 5,280,156 | A | | 1/1994 | Niori et al. | ................ 219/385 |
| 5,343,022 | A | | 8/1994 | Gilbert et al. | ............... 219/552 |
| 5,478,429 | A | * | 12/1995 | Komino et al. | ........ 156/345.44 |
| 5,606,484 | A | | 2/1997 | Kawada et al. | |
| 5,702,764 | A | | 12/1997 | Kimura et al. | ........... 427/248.1 |
| 5,710,407 | A | * | 1/1998 | Moore et al. | ............... 219/405 |

(Continued)

FOREIGN PATENT DOCUMENTS

EP    1376660    1/2004

*Primary Examiner*—Ram N. Kackar
*Assistant Examiner*—Rakesh K. Dhingra
(74) *Attorney, Agent, or Firm*—Dominick G. Vicari

(57) ABSTRACT

A wafer processing device or apparatus, i.e., a heater or an electrostatic chuck, comprises a planar support platen, a support shaft having centrally located bore, and a pair of electrical conductors located in the shaft. In one embodiment, the electrical conductors are concentrically located within the bore of the shaft, with the first electrical lead being in the form of a pyrolytic graphite rod and separated from the outer second graphite electrical lead by means of a pyrolytic boron nitride (pBN) coating. In a second embodiment, the support platen and the support shaft are formed from a single unitary body of graphite. In yet another embodiment of the device of the invention, the connection posts comprise a carbon fiber composite and the exposed ends of the electrical connectors are coated with a protective ceramic paste for extended life in operations.

11 Claims, 3 Drawing Sheets

U.S. PATENT DOCUMENTS

| | | | |
|---|---|---|---|
| 5,748,436 A | 5/1998 | Honma et al. | |
| 5,811,820 A * | 9/1998 | Kirchner et al. | 250/432 R |
| 6,023,405 A | 2/2000 | Shamouilian et al. | 361/234 |
| 6,066,836 A | 5/2000 | Chen et al. | 219/390 |
| 6,072,163 A | 6/2000 | Armstrong et al. | |
| 6,081,414 A * | 6/2000 | Flanigan et al. | 361/234 |
| 6,113,984 A * | 9/2000 | MacLeish et al. | 427/255.32 |
| 6,143,081 A * | 11/2000 | Shinriki et al. | 118/719 |
| 6,213,478 B1 * | 4/2001 | Nishikawa | 279/4.08 |
| 6,214,121 B1 | 4/2001 | Cho et al. | 118/724 |
| 6,310,327 B1 | 10/2001 | Moore et al. | 219/405 |
| 6,410,172 B1 | 6/2002 | Gilbert et al. | 428/698 |
| 6,507,006 B1 | 1/2003 | Hiramatsu et al. | 219/444.1 |
| 6,535,372 B2 * | 3/2003 | Parkhe et al. | 361/234 |
| 6,678,143 B2 * | 1/2004 | Masuda et al. | 361/234 |
| 6,793,767 B2 * | 9/2004 | Chu et al. | 156/345.43 |
| 2002/0051848 A1 | 5/2002 | Chou | 427/376.6 |
| 2002/0185487 A1 * | 12/2002 | Divakar et al. | 219/444.1 |
| 2003/0080109 A1 | 5/2003 | Choi et al. | 219/444.1 |
| 2003/0107865 A1 * | 6/2003 | Masuda et al. | 361/234 |
| 2003/0164369 A1 | 9/2003 | Goetz | 219/543 |
| 2003/0217767 A1 * | 11/2003 | Kushihashi et al. | 136/230 |
| 2004/0108314 A1 * | 6/2004 | Kano et al. | 219/764 |

* cited by examiner

WAFER HANDLING APPARATUS AND METHOD OF MANUFACTURING THEREOF

CROSS-REFERENCE TO RELATED APPLICATIONS

This application claims priority of U.S. Application No. 60/441,165, filed on Jan. 17, 2003 and U.S. Patent Application No. 60/442,409, filed on Jan. 24, 2003.

FIELD OF THE INVENTION

The invention relates generally to a wafer handling apparatus for use in the manufacture of semiconductors.

BACKGROUND

Wafer handling apparatuses, e.g., heaters and electrostatic chucks, are used in a number of system applications such as molecular beam epitaxy, space experiments, substrate heaters for electron microscopy and in the growth of superconducting films, etc. Heaters are typically used to heat a semiconductor wafer in the manufacture of semiconductors. A wafer handling assembly may include a susceptor for supporting a wafer, and a plurality of heaters disposed under the susceptor to heat the wafer. The semiconductor wafer is heated within a confined environment in a processing vessel at relatively high temperature and often in an atmosphere, which is highly corrosive. The temperature to which the wafer is heated is also controlled to within a predetermined range after reaching a desired processing temperature. Heretofore, the heating device typically consists of a heating platen formed of a sintered ceramic body in which a refractory metal wire was embedded. The refractory metal wire operates as a heat generating resistive element when connected to an external power supply. However, because the resistive element is embedded in a ceramic material the amount of power the heating device can generate and deliver to the wafer is limited which limits the amount of power available.

Pyrolytic boron nitride (PBN) is formed by chemical vapor deposition of boron nitride in a reactor chamber by the vapor phase reaction of ammonia and a boron containing gas such as boron trichloride ($BCl_3$). The pyrolytic boron nitride is of very high purity and when separated or released from the substrate forms a self-standing article of purified pyrolytic boron nitride. In other cases, the pyrolytic boron nitride coating can be made to adhere to the substrate to form a coated article.

In the prior art, heaters typically include a dielectric base of boron nitride and a heating element formed from a conductive material capable of resistive heating such as graphite and more particularly pyrolytic graphite. The heating element is connected to an external power supply to form a resistive heater. In certain applications such as in the growth of superconducting films, it is necessary to introduce oxygen into the atmosphere of the reacting chamber in which the superconducting film is grown. The oxygen in the atmosphere will react with any exposed graphite conductor in the heating unit to oxidize the conductor causing an open circuit.

U.S. Pat. No. 5,343,022 discloses a pyrolytic heating element in which multiple graphite post (or shaft) connectors are used. The shafts have internal tapped holes for attachment to an external power supply. The assembled heating element and shafts are then coated with a pyrolytic boron nitride layer to encapsulation the conductor and shafts to isolate the graphite from the process chemistry. In this design with multiple electrical leads in separate posts, the mechanical connection around the leads tend to increase stress in thermal expansion during operation thus often breaking the heating element or the leads. In some applications, the thermal stress of the installation can cause an arc at the point of electrical contact with the heating element which will damage the heating unit and render it nonfunctional.

U.S. Pat. No. 6,066,836 discloses a heating structure having a resistive heating substrate holder including a support surface (wafer holder) and a support shaft comprising a relatively pure compound of aluminium nitride (AlN), wherein the support shaft is diffusion bonded to the wafer holder.

Applicants have also discovered a wafer processing apparatus, e.g., a heating device, employing a unitary construction, e.g., an assembly of a graphite support plate containing CVD (chemical vapor deposition) film of pyrolytic graphite as the active heating element connected through conductors to an outside source of electrical power to heat the semiconductor wafer, and a graphite shaft containing the electrical conductors and protecting them from exposure to the hostile corrosive atmosphere within the vessel used to process the semiconductor wafer. The use of graphite as opposed to AlN in the prior art, surprisingly improves the performance of the heating structure in the manufacture of semiconductor wafers.

The present invention further relates to a novel design of an electrical connection assembly for a pyrolytic heating element having improved mechanical strength and extended life in operations.

SUMMARY OF THE INVENTION

The invention relates to a wafer processing device comprising an assembly of: a) a graphite platform adapted for placement of an object to be heated, the platform including a graphite substrate; and b) a graphite shaft extending substantially transverse to the platform; the graphite substrate is coated with a first layer of a material selected from pyrolytic boron nitride and aluminum nitride, a second layer of pyrolytic graphite disposed on the first coating and patterned in an arrangement of predetermined geometry having two separate ends for forming at least an electrode, and a third coating of a dielectric material superimposed on said first and second coatings.

In one embodiment of the invention, the graphite core of the shaft may be solid or hollow, further comprises at least two electrical conductors for connecting the electrode to an external source of power. In one embodiment, the electrical conductors are symmetrically disposed on opposite sides of the graphite shaft. In a second embodiment, the electrical conductors are concentrically disposed within the graphite shaft. [Good!]

The invention further relates to a wafer-processing device wherein the connection posts comprise a carbon fiber composite and the exposed ends of the electrical connectors are coated with a protective ceramic paste for extended life in operations.

DESCRIPTION OF THE INVENTION

As used herein, the wafer processing device or apparatus of the invention refers to a device for producing a semiconductor or examining a semiconductor. Examples include an electrostatic chuck, a heating jig, a hot plate (ceramic heater), and the like.

Figure 1:
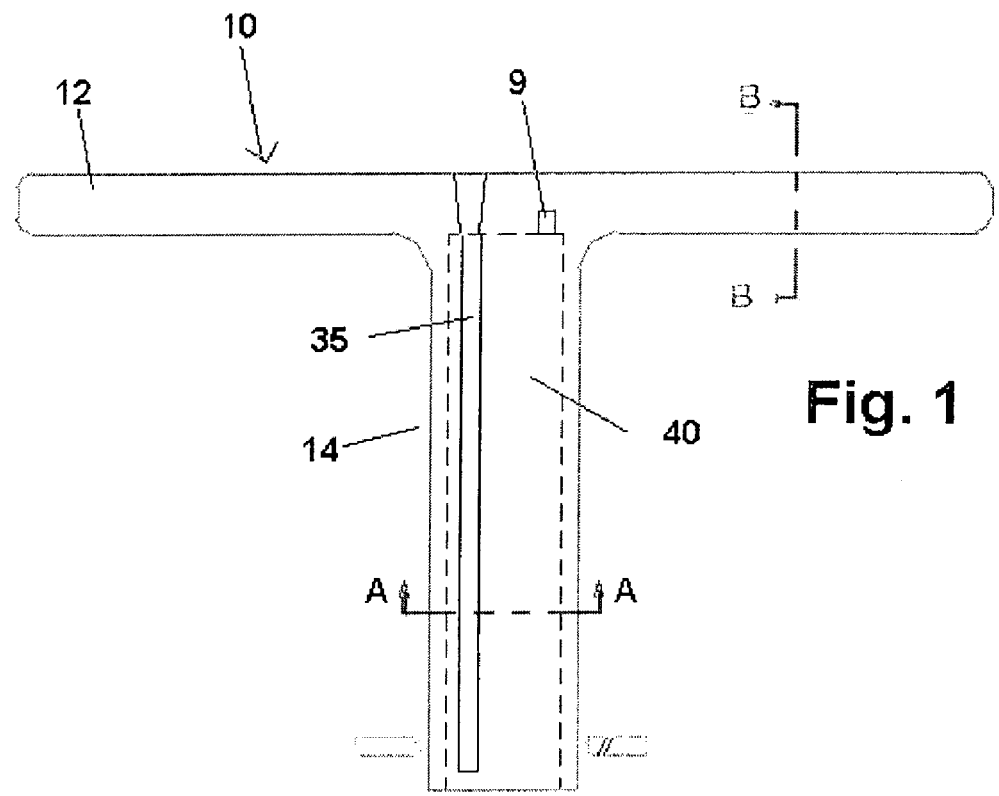
FIG. 1 is a cross sectional view of an embodiment of the heating device of the present invention.

Unitary Assembly of Substrate Holder and Support Shaft Comprising Graphite. Referring to FIG. 1 showing a schematic cross section of one embodiment of the wafer heating apparatus 10 of the invention, with a resistive substrate holder 12 and a mounting structure 14. The substrate holder has a planar surface upon which a substrate of semiconductor material (not shown) may be placed for processing in a semiconductor wafer fabrication chamber.

In one embodiment of the invention, the wafer heating apparatus 10 comprises a unitary assembly of a platform 12 and a mounting structure 14 in the form of a shaft extending from the platform 12, and substantially transverse to the longitudinal axis of the platform 12.

Figure 2:
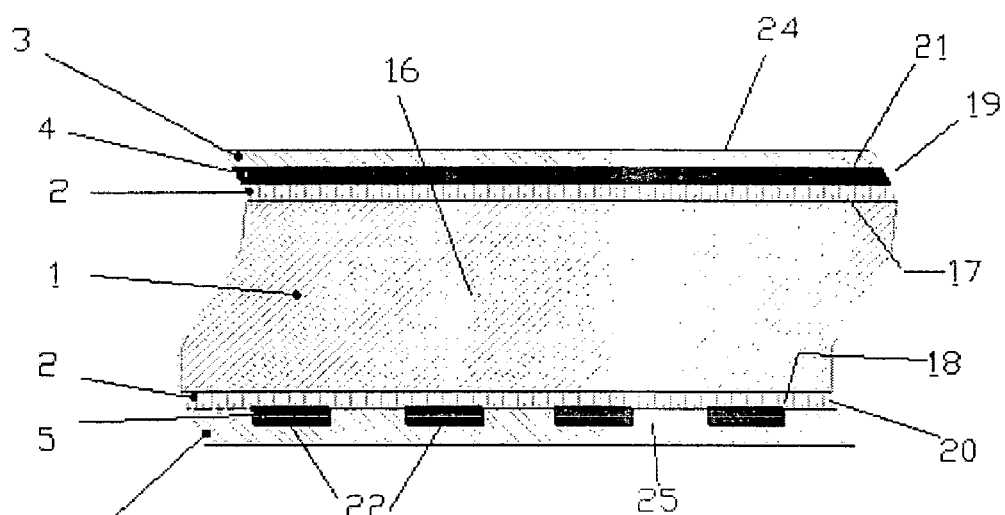
FIG. 2 is a cross sectional view of the wafer support platform, taken along the lines B-B in FIG. 1.

In one embodiment, the platform 12 comprises a substrate 16 composed of graphite which may be machined into any desired configuration, such as that of a disk, a platen, or a cylinder. FIG. 2 is a cross-section view of a portion of the platform 12, taken along the lines B-B of FIG. 1, showing substantially flat surfaces 17 and 18 on the opposite sides thereof representing the tipper and lower surfaces of the substrate 16, with one or more superimposed coated layers formed by chemical vapor deposition (CVD) or processes known in the art as hereafter explained in more detail.

As shown, dielectric base layers 19 and 20 are deposited as a coating on each of the flat surfaces 17 and 18 of the graphite substrate 16. Thereafter, pyrolytic graphite layers 21 and 22 are deposited (e.g., via CVD) over each of the dielectric base layers 19 and 20 respectively. Pyrolytic graphite is essentially highly oriented polycrystalline graphite produced by high temperature pyrolysis of a hydrocarbon gas such as methane, ethane, ethylene, natural gas, acetylene and propane.

In one embodiment, an overcoat of dielectric material 24 and 25 is deposited over the pyrolytic graphite layers 21 and 22 respectively. The dielectric layers encapsulate the upper and lower pyrolytic graphite layers 21 and 22 layers respectively. The upper pyrolytic graphite layer 21 is encapsulated between the dielectric layers 19 and 24, and the lower pyrolytic layer 22 is encapsulated between the dielectric layers 20 and 25 respectively.

The dielectric coating layer of the invention comprises at least one of a nitride, carbide, carbonitride or oxynitride of elements selected from a group consisting of B, Al, Si, Ga, refractory hard metals, transition metals, and rare earth metals, or complexes and/or combinations thereof. Examples include pyrolytic boron nitride, aluminum nitride, titanium aluminum nitride, titanium nitride, titanium aluminum carbonitride, titanium carbide, silicon carbide, and silicon nitride. In one embodiment, the coating layer comprises pBN. In a second embodiment, the layer comprises AlN. In a third embodiment, a complex of AlN and BN. In a fourth embodiment, the coating dielectric layer comprises a composition of pyrolytic boron nitride (PBN) and a carbon dopant in an amount of less than about 3 wt % such that its electrical resistivity is smaller than $10^{14}$ Ω-cm. In yet a fifth embodiment, the coating layer comprises an aluminum nitride wherein a small amount of $Y_2O_3$ is added, e.g. in amount of 5 wt % relative to 100 wt % of aluminum nitride. Both pBN and AlN have excellent insulating and conducting properties and can be easily deposited from the gaseous phase. They also have a high temperature stability. Additionally, they have a different color (white) than the pyrolytic graphite base (black) such that in the step of forming the electrical patterns, the coating layer can be easily visually distinguished from the patterns.

In one example of the invention, pBN is used as the dielectric material, which is very anisotropic with a thermal conductivity in the planar surface thereof of typically 30 times or more above the thermal conductivity in the transverse direction through its thickness. pBN is typically formed by a chemical vapor deposition process as described in U.S. Pat. No. 3,182,006. The process involves introducing vapors of ammonia and a gaseous boron halide such as boron trichloride ($BCl_3$) in a suitable ratio to form a pyrolytic boron nitride deposit on the surface of an appropriate substrate, which in one embodiment, would be the pyrolytic graphite coated graphite body 16.

In yet another embodiment of the invention, either one of the coated layers of pyrolytic graphite 21 or 22, is machined into a pre-determined pattern, e.g., in a spiral or serpentine geometry, so as to form a resistance heating element or an electrical flow path in the form of an elongated continuous strip of pyrolytic graphite having opposite ends (not shown). In another embodiment, the electrical flow path has at least one of a spiral pattern, a serpentine pattern, a helical pattern, a zigzag pattern, a continuous labyrinthine pattern, a spirally coiled pattern, a swirled pattern, a randomly convoluted pattern, and combinations thereof.

In another embodiment, the coated layer of pyrolytic graphite 21, i.e., the upper coated layer, may be left intact or may be used as an RF pole or may be used for electrostatic chuck electrodes.

Figure 3:
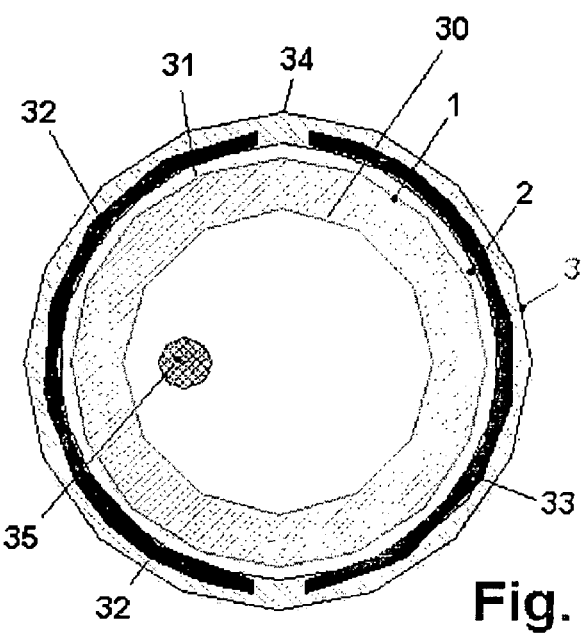
FIG. 3 is a cross sectional view of one embodiment of the shaft, taken along the lines A-A in FIG. 1.

The shaft 14, which cross-section of one embodiment of the invention is shown in FIG. 3, is machined from a solid body of graphite to form a hollow graphite core 30, to be later diffusion bonded into the graphite substrate 16. In another embodiment, the shaft 14 is manufactured in unison with the formation of the graphite substrate 16, such that the shaft 14 and platform 12 define a single unitary graphite body.

As shown in the Figure, a dielectric layer 31 is superimposed upon the hollow graphite core 30 of the shaft 14. Two conductive layers 32 and 33 are then formed over the dielectric layer 31 on opposite lateral sides of the graphite core 30. In one embodiment, the conductive layers 32 and 33 comprise pyrolytic graphite. A dielectric material 34, e.g., a pBN coating layer or any of the dielectric materials described above, is then deposited as an overcoat over the two conductive layers 32 and 33. In one embodiment, the dielectric layer 31 is formed at the same time the dielectric base layers 19 and 20 are formed. Likewise in one embodiment, the dielectric layer 34 is formed when forming the dielectric layers 24 and 25 on the graphite substrate 16. In this way, the conductors 32 and 33 are each also encapsulated in dielectric material.

In one embodiment, each of the "coating" layers has a thickness of 0.005 to 0.20 inches. In another embodiment, from about 0.01 to 0.10 inches. In a third embodiment, the overcoat layer has a thickness of less than about 0.05 inches.

It should be noted that one or more layers may be included to provide improved thermal matching between the components to prevent bending or fracture of different layers having different coefficients of thermal expansion. Layers that improve the adhesion between the layers and the substrate may also be used.

It should also be noted that different methods can be used to deposit the coating layer or layers onto the graphite shaft/body/substrate. In one embodiment, at least one of the layers can be applied through physical vapor deposition (PVD), wherein the coating material, e.g. boron nitride and/or aluminum nitride is/are transferred in vacuum into the gaseous phase through purely physical methods and are deposited on the surface to be coated. A number of method variants can be used. In one embodiment, the coating material is deposited onto the surface under high vacuum, wherein it is heated to transition either from the solid via the liquid into the gaseous state or directly from the solid into the gaseous state using electric resistance heating, electron or laser bombardment, electric arc evaporation or the like. Sputtering can also be used, wherein a solid target which consists of the respective coating material is atomized in vacuum by high-energy ions, e.g. inert gas ions, in particular argon ions, with the ion source being e.g. an inert gas plasma. Finally, a target which consists of the respective coating material can also be bombarded with ion beams under vacuum, be transferred into the gaseous phase and be deposited on the surface to be coated. Of course, the above-mentioned PVD methods can also be combined and at least one of the layers can be deposited e.g. through plasma-supported vapor deposition.

Alternatively in one embodiment of the invention or as an additional coating layer, one of the layers can be deposited through chemical vapor deposition (CVD). In yet another embodiment of the invention, at least one of the layers can also be deposited using thermal injection methods, e.g. by means of a plasma injection method. In another embodiment, a thermal spray process is used. In another embodiment for a relatively "thick" coating layer, i.e., of 0.03 inches or thicker, the coating material is applied simply as a liquid paint and then dried at sufficiently high temperatures to dry out the coating.

In one embodiment, the encapsulated pyrolytic graphite layer 22 is disposed on the lower bottom surface of the graphite substrate 16. Conductors 32 and 33 are connected at one end thereof to the respective ends (not shown) of the machined lower pyrolytic graphite coated layer 22, with the opposite end of the conductors 32 and 33 adapted to extend outside the healing device 10, where each conductor 32 and 33 is connected (not shown) to an external power source. In one embodiment of the invention, conductors 32 and 33 in shaft 14 are connected to patterned pyrolytic graphite heater 22 via connection posts (not shown) of pBN coated graphite.

In yet another embodiment of the invention, the upper encapsulated pyrolytic graphite layer 21 serves as an Rf plane for plasma generation, in which case an additional graphite post 35 is provided in the hollow shaft 14 for connecting to the upper graphite layer 21 to serve as an internal conductor. In this case, shaft 14 may also be hollow, or post 35 may be slip fit into a bore formed in shaft 14 so that shaft 14 can remain essentially solid.

Improved Electrical Post Connections. In one embodiment of the invention, connection posts (or pins) are made from a carbon fiber composite material, subsequently coated with a dielectric coating layer, e.g., pBN, for protection from chemical attacks in the wafer-processing environment. As used herein, carbon fiber composite materials refer to materials comprising a carbon-matrix, e.g. carbon/carbon composite or carbon fiber composite. Such a material provides high stiffness, low density, and essentially zero coefficient of thermal expansion (CTE), commercially available from numerous sources in various forms, pre-impregnated with uncured and heat-curable epoxy resin binder or as fabric to which binder is added later.

Oxidation or other attack from the process chemistry is known to be a primary source of post connection failures in heaters. Experiments have shown that heating devices employing carbon fiber composite connection posts of the present invention in one embodiment, experience only one third of the failure rates of the graphite post connectors of the prior art.

Figure 4:
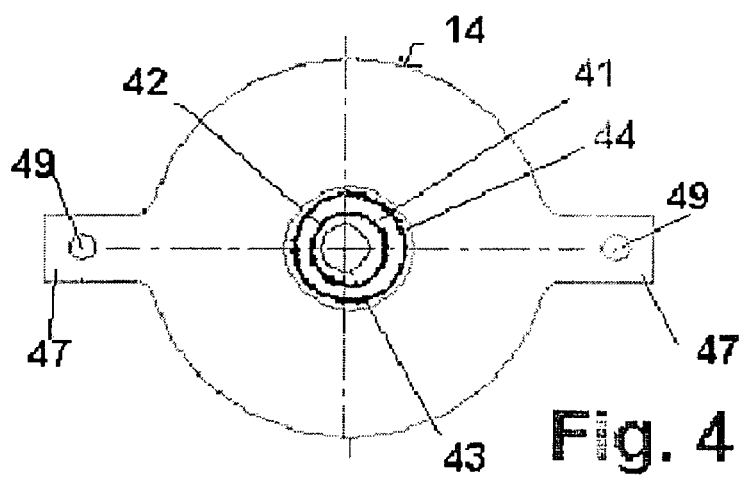
FIG. 4 is cross section view of another embodiment of the shaft of the invention, taken along the lines A-A of FIG. 1.

Wafer Heating Apparatus with Concentric Electrical Connections: In one embodiment of invention, the two conductors or electrical leads are in a concentric design in the shaft 14 as shown in FIG. 4. As used herein, concentric means one of the electrical conductor is within the other electrical conductor, e.g., one electrical lead being outside or surrounding the other electrical lead. In one embodiment, the $1^{st}$ electrical conductor is within a $2^{nd}$ electrical conductor with both conductors having a common centre, or a relatively common centre with one another. In a third embodiment, the $1^{st}$ and $2^{nd}$ electrical conductors are of a concentric design and forming an essentially solid shaft.

In one embodiment, multiple "pairs" of concentric conductors may be disposed within the hollow core of a unitary shaft. In yet another embodiment of a wafer having two support posts or shafts, each pair of concentric conductors is contained within each of the two support shafts.

As illustrated in the Figure, the first electrical lead 42 (can be a positive or a negative) is machined from a graphite rod, and is isolated from the other reverse lead 43 (a negative or a positive) by means of a dielectric coating layer 41, e.g., pBN, with the reverse or second lead being in the form of the outer graphite concentric layer. Both electrical leads (or conductors) are then coated with at least another dielectric coating layer for protection.

In another embodiment of the invention for a concentric electrical connection, the conductors are located outside of the shaft 14 with the first electrical lead being adjacent to and right outside of shaft 14, and the second electrical lead being separated from the first electrical lead with a pBN coating layer, and also overcoated with a pBN layer 44 for protection from the wafer processing environment.

It should be noted that the single (concentric design) takes up less area than the sum of two separate leads as in the prior art. It should also be noted that multiple sets of concentric electric leads may be used or contained in a graphite post or shaft, and that the concentric design may be used with heating devices employing a unitary assembly or with multiple connection posts.

Improved Contact Hole (Via) Construction. As previously indicated, Applicants have found that the use of graphite as the construction material for the assembly of the substrate holder/platform 12 and the mounting structure 14 surprisingly provides a wafer support apparatus with a much higher level of thermal stress tolerance, as compared to the wafer support apparatuses of the prior art.

In one embodiment of the invention, the unitary assembly is formed out of a single piece of graphite, machined to form the platform 12 and the mounting structure 14. In another embodiment, the platform 12 and the mounting stricture 14 are machined out of two pieces of graphite and then bonded together forming a unitary assembly.

In one embodiment of the invention wherein the platform 12 and mounting structure 14 are constructed from two pieces of graphite, the mounting structure or shaft 14 is assembled into platform 12 through via 51. As used herein, "via" is used interchangeably with "contact hole" to indicate a hole or cylindrical bore through the platform 12, for a mounting stricture, post, pedestal post, or shaft to be inserted through.

Figures 5A, 5B:
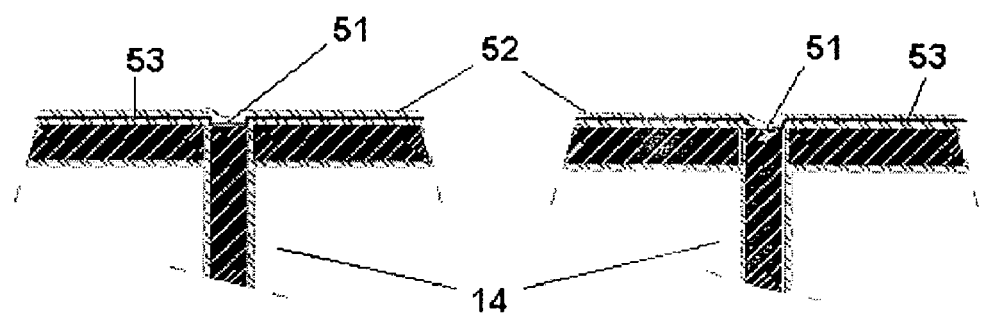
FIG. 5A is a cross-sectional view showing the contact hole or via in a heating device in the prior art.
FIG. 5B is a cross-sectional view showing the contact hole in one embodiment of the heating device of the invention.

In one embodiment of the assembly process, a mill is used to machine the via 51 in the graphite layer 53 of platform 12. As illustrated in FIGS. 5A and B, graphite rod 14 coated with a dielectric layer, e.g., pBN, is inserted through and seated in via 51. After the insertion of rod 14 through via 51, the raised top surface of the rod 14 may be optionally machined for to the surface to the even with the surface of platform 12. The top surface of platform 12, including the exposed top of graphite rod 51 (through via 51) is subsequently coated with a dielectric coating layer 52 such as pBN.

In one embodiment of the invention, a ball mill is used to bore via 51 in platform 12 prior to the assembly of graphite rod 14, for a contact hole having rounded corner or recessed line. Applicants have found that the use of a radiused ball mill or similar tools known in the art, for boring a contact hole having edges with a radiused, or rounded, smooth, and curved transition or shape as illustrated in FIG. 5B, surprisingly prolongs the life of wafer heaters of the present invention, as compared to wafer heaters having contact holes with square or straight corners as illustrated in FIG. 5A for a via or contact hole machined using a flat end mill.

Conductor Contact Ends Having Protective Layer. As illustrated above, the conductors (32, 33, 42, 42) in the wafer heating apparatus of the invention connect the resistance heating electrodes, i.e., the terminal ends of the machined/patterned pyrolytic graphite coated layer (21 or 22), to a power supply.

Figures 6A, 6B:
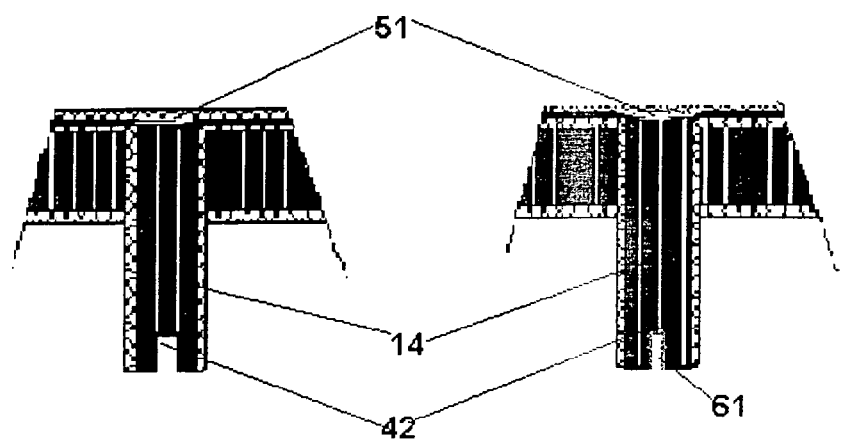
FIG. 6A is a cross sectional view showing exposed conductor ends in a heating device in the prior art.
FIG. 6B is a cross-sectional view showing coated conductor ends in one embodiment of the heating device of the invention.

Parts of the conductors are expected to be exposed to the atmosphere in the semi-conductor wafer processing vessel, as illustrated in FIG. 6A with exposed conductor part 42. In high temperature applications where oxygen or other corrosive materials are present, the exposed conductor parts can be chemically attacked, thus producing high resistance areas and localized hot spots. This in turn, will accelerate the attack and ultimately produce an open circuit.

In one embodiment of the invention as illustrated in FIG. 6B, a metal covering layer or a ceramic paste is applied to the exposed conductor 42 forming a coating 61 to protect the conductor from attack, and subsequently improves the lifetime of the electrical contact. The covering layer prevents or lessens a change in the ohmic resistance value resulting from the oxidation of the electrical conductor. In one embodiment, the covering layer has a thickness of at least 10 microns.

In one embodiment, the exposed conductor ends are coated with a piezoelectric ceramic paste/plasticiser/conductor composition, which becomes electrically conductive after sintering. In another embodiment, the conductor ends are coated with a composition of silver oxide/lead zirconate titanate (PZT)/polyvinyl alcohol plasticizer. In another embodiment, the conductor ends or terminals are coated with a commercially available ceramic paste containing a metal oxide, e.g., a silver oxide such as Artic Silver Ceramic Thermal Paste. In yet another embodiment, the conductor ends are coated with a ceramic compound comprising a combination of yttrium oxide, zirconia and silicon nitride.

Figures 8A, 8B:
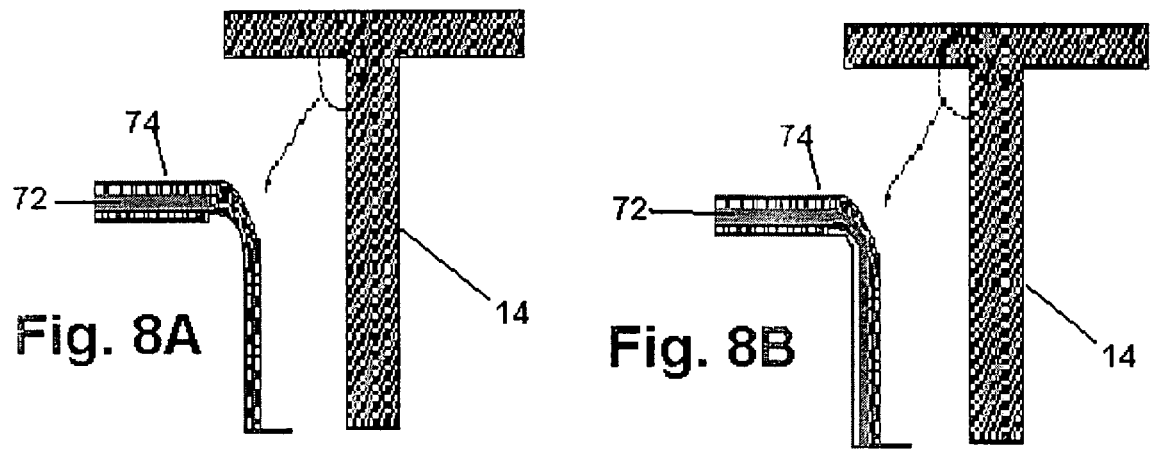
FIG. 8A is a cross-sectional view showing a heating device in the prior art.
FIG. 8B is a cross sectional view showing one embodiment of the heater of the invention, with extended heater surface for shaft loss compensation.

Extended Heater Surface for Shaft Loss Compensation. Uniform temperature across the wafer is a critical process variable for semiconductor wafer processing, with a typical temperature uniformity requirement of +/−1% across the wafer at 600° C. As illustrated in FIG. 8A, the end of shaft 14 away from the platform 12 is isolated from the semiconductor wafer processing environment, which is typically at atmospheric pressure and ambient temperature. Because of the shaft configuration, shaft 14 acts like a large heat sink and thus causing a lower temperature region in the middle of the platform 12.

Figure 7:
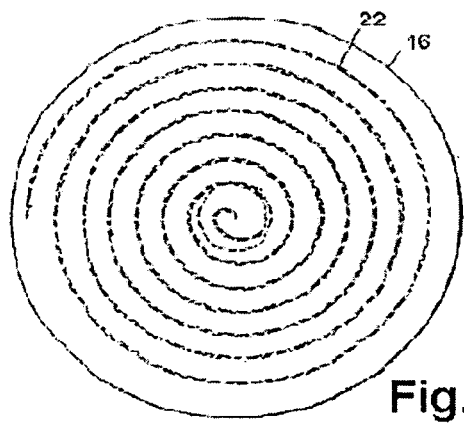
FIG. 7 is a top view showing one embodiment of the patterned heating element in the heating device of the invention.

In one embodiment of the invention, either or both of the coated graphite layers is machined into standard heating element design, e.g., adjacent series webs, spiral webs, helical webs, parallel paths, variable resistance or other serpentine electrical resistance circuit paths, to help regulate and achieve the required temperature uniformity. In a second embodiment, either the top 21 or bottom 22 coated pyrolytic graphite layer is machined into a spiral pattern as illustrated in FIG. 7, for either the upper or lower surface of platform 12. The forming of an electrical pattern, i.e., an electrically isolated, resistive heater path, may be done by techniques known in the art, including but not limited to micro machining, micro-brading, laser cutting, chemical etching, or e-beam etching.

In one embodiment of the invention, the patterned pyrolytic graphite heating layer 72 (coated with dielectric layer 74) is extended from the flat surface of the platform 12 to the shaft 14 as illustrated in FIG. 8B to overcome the heat loss down the shaft. The extension of the heating element 72 surprisingly improves temperature uniformity across the wafer.

In one embodiment of the invention, the patterned pyrolytic graphite layer 72 is extended downward from the flat surface of the platform to cover at least 5% of the length of the shaft 14. In a second embodiment, the patterned pyrolytic graphite layer or heating element 72 is extended downward to cover a length of 2" of a shaft length of 10". In a third embodiment, the patterned pyrolytic graphite layer or heating element 72 is extended downward to cover at least 25% of the length of shaft 14. In a fourth embodiment, the patterned pyrolytic graphite layer or heating element 72 is extended downward to cover at up to 30% of the length of shaft 14.

While the invention has been described with reference to a preferred embodiment, those skilled in the art will understand that various changes may be made and equivalents may be substituted for elements thereof without departing from the scope of the invention. All citations referred herein are expressly incorporated herein by reference.

The invention claimed is:

1. A wafer processing device comprising:
   a platform for supporting an object to be heated, the platform comprises a substrate having upper and lower relatively flat surfaces, the platform is comprised of graphite;
   a shaft extending substantially transverse to the platform, the shaft is comprised of graphite;

a first coating on at least one of the flat surfaces, with said first coating composed of at least a material selected from the group consisting of a nitride, carbide, carbonitride or oxynitride of elements selected from a group consisting of B, Al, Si, Ga, refractory hard metals, transition metals, and combinations thereof;

a second coating layer composed of pyrolytic graphite disposed on the first coating in a patterned arrangement of predetermined geometry, the layer having at least two separate ends adapted for forming at least an electrode; and a top coating of a dielectric material superimposed on said first and second coatings, the top coating is composed of at least a material selected from the group consisting of a nitride, carbide, carbonitride or oxynitride of elements selected from a group consisting of B, Al, Si, Ga, refractory hard metals, transition metals, and combinations thereof;

wherein the graphite shaft and the graphite platform form a single unitary body, and wherein the graphite shaft is a rod with a hollow core, wherein the graphite shaft further includes at least two electrical conductors for connecting the electrode to an external source of power, each electrical conductor being in contact with, and surrounded by, dielectric material, wherein the two electrical conductors are symmetrically disposed on opposite sides of an exterior surface of the graphite shaft.

2. The wafer processing device of claim 1, wherein the device is an electrostatic chuck and the electrode is a chuck electrode.

3. The wafer processing device of claim 1, wherein the device is a heater and the electrode is a heating element electrode.

4. The wafer processing device of claim 1, wherein the graphite platform is one of a disk, a platen, and a cylinder.

5. The wafer processing device of claim 1, wherein the second coating is patterned to form a continuous elongated strip of pyrolytic graphite arranged in at least one of electrical flow path has at least one of a spiral pattern, a serpentine pattern, a helical pattern, a zigzag pattern, a continuous labyrinthine pattern, a spirally coiled pattern, a swirled pattern, a randomly convoluted pattern, and combinations thereof.

6. The wafer processing device of claim 5, wherein the patterned second coating is formed on said lower surface of said platform.

7. The wafer processing device of claim 1, wherein said pyrolytic graphite second coating layer is encapsulated in at least a nitride, carbide, carbonitride or oxynitride of elements selected from a group consisting of B, Al, Si, Ga, refractory hard metals, transition metals, and rare earth metals, or complexes and/or combinations thereof.

8. The wafer processing device of claim 7, wherein said pyrolytic graphite second coating layer is encapsulated in AlN or pyrolytic boron nitride.

9. The wafer processing device of claim 1, wherein:
each electrical conductor has an end adapted for connecting to the external source of power, and the end of each of the electrical conductors is coated with at least a ceramic paste comprising at least one of a piezoelectric ceramic paste, a plasticiser, a conductor, and combinations thereof.

10. A wafer processing device comprising:
a platform for supporting an object to be heated, the platform comprises a substrate having upper and lower relatively flat surfaces, the platform is comprised of graphite;

a shaft extending substantially transverse to the platform, the shaft is comprised of graphite;

a first coating on at least one of the flat surfaces, with said first coating composed of at least a material selected from the group consisting of a nitride, carbide, carbonitride or oxynitride of elements selected from a group consisting of B, Al, Si, Ga, refractory hard metals, transition metals, and combinations thereof;

a second coating layer composed of pyrolytic graphite disposed on the first coating in a patterned arrangement of predetermined geometry, the layer having at least two separate ends adapted for forming at least an electrode; and a top coating of a dielectric material superimposed on said first and second coatings, the top coating is composed of at least a material selected from the group consisting of a nitride, carbide, carbonitride or oxynitride of elements selected from a group consisting of B, Al, Si, Ga, refractory hard metals, transition metals, and combinations thereof;

wherein the graphite shaft and the graphite platform form a single unitary body, and wherein the graphite shaft further includes at least two electrical conductors for connecting the electrode to an external source of power, wherein said two electrical conductors are coated layers of pyrolytic graphite symmetrically disposed on opposite sides of said graphite shaft wherein said two electric conductors each extend lengthwise along the graphite shaft and are integral therewith.

11. A wafer processing device comprising:
a platform for supporting an object to be heated, the platform comprises a substrate having upper and lower relatively flat surfaces, the platform is comprised of graphite;

a shaft extending substantially transverse to the platform, the shaft is comprised of graphite;

a first coating on at least one of the flat surfaces, with said first coating composed of at least a material selected from the group consisting of a nitride, carbide, carbonitride or oxynitride of elements selected from a group consisting of B, Al, Si, Ga, refractory hard metals, transition metals, and combinations thereof;

a second coating layer composed of pyrolytic graphite disposed on the first coating in a patterned arrangement of predetermined geometry, the layer having at least two separate ends adapted for forming at least an electrode; and a top coating of a dielectric material superimposed on said first and second coatings, the top coating is composed of at least a material selected from the group consisting of a nitride, carbide, carbonitride or oxynitride of elements selected from a group consisting of B, Al, Si, Ga, refractory hard metals, transition metals, and combinations thereof;

wherein the graphite shaft and the graphite platform form a single unitary body, and wherein the graphite shaft is a rod with a hollow core, wherein the graphite shaft further includes at least two electrical conductors for connecting the electrode to an external source of power, each electrical conductor being in contact with, and surrounded by, dielectric material, wherein said first electrical conductor is in a form of a graphite rod, the second electrical conductor is a hollow graphite rod, and wherein the first and second electrical conductors are separated by means of a coating layer comprising a material selected from the group of least a nitride, carbide, carbonitride or oxynitride of elements selected from a group consisting of B, Al, Si, Ga, refractory hard metals, transition metals, and rare earth metals, or complexes and/or combinations thereof.

* * * * *